United States Patent
Lai et al.

(10) Patent No.: US 10,879,232 B2
(45) Date of Patent: Dec. 29, 2020

(54) CIRCUIT, SYSTEM AND METHOD FOR ELECTROSTATIC DISCHARGE (ESD) PROTECTION

(71) Applicant: TAIWAN SEMICONDUCTOR MANUFACTURING COMPANY LTD., Hsinchu (TW)

(72) Inventors: Ming-Fang Lai, Hsinchu (TW); Ming-Cheng Lin, Yilan County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 220 days.

(21) Appl. No.: 15/902,431

(22) Filed: Feb. 22, 2018

(65) Prior Publication Data

US 2019/0115339 A1    Apr. 18, 2019

Related U.S. Application Data

(60) Provisional application No. 62/572,085, filed on Oct. 13, 2017.

(51) Int. Cl.
*H01L 27/02* (2006.01)
*H01L 29/778* (2006.01)
(Continued)

(52) U.S. Cl.
CPC ...... *H01L 27/0266* (2013.01); *H01L 27/0285* (2013.01); *H01L 29/7787* (2013.01); *H02H 9/046* (2013.01)

(58) Field of Classification Search
CPC ............. H01L 27/0266; H01L 27/0285; H01L 29/7787; H02H 9/046; H02H 9/025; H02H 9/02
(Continued)

(56) References Cited

U.S. PATENT DOCUMENTS 5,311,391 A * 5/1994 Dungan ................. H02H 9/046
361/56
5,838,146 A * 11/1998 Singer .................... H02H 9/046
323/270

(Continued)

FOREIGN PATENT DOCUMENTS

| CN | 102739164 |   | 10/2012 |
| CN | 102739164 | A | 10/2012 |
| CN | 107039437 | A | 8/2017 |

OTHER PUBLICATIONS

Office Action and Search Report dated Aug. 2, 2019 issued by Germany Patent and Trade Mark Office for counterpart application No. 102018124676.

(Continued)

*Primary Examiner* — Dharti H Patel
(74) *Attorney, Agent, or Firm* — WPAT, P.C., Intellectual Property Attorneys; Anthony King

(57) ABSTRACT

A circuit including a discharging device, a resistive element and a bypass device is disclosed. The discharging device is disposed between a first voltage bus and a second voltage bus. The resistive element is configured to activate the discharging device in response to a high-to-low electrostatic discharge (ESD) event during which the first voltage bus is high in potential relative to the second voltage bus. The bypass device is configured to bypass the resistive element and activate the discharging device in response to a low-to-high ESD event during which the second voltage bus is high in potential relative to the first voltage bus.

20 Claims, 9 Drawing Sheets

(51) Int. Cl.
*H01H 9/04* (2006.01)
*H02H 9/04* (2006.01)

(58) Field of Classification Search
USPC .......................................................... 361/56
See application file for complete search history.

(56) References Cited

U.S. PATENT DOCUMENTS

| | | | |
|---|---|---|---|
| 6,249,410 B1* | 6/2001 | Ker | H01L 27/0251 361/111 |
| 7,570,468 B2* | 8/2009 | Bernard | H02H 9/046 361/56 |
| 8,767,366 B2 | 7/2014 | Ping et al. | |
| 2002/0153570 A1* | 10/2002 | Lin | H01L 27/0266 257/355 |
| 2018/0026029 A1* | 1/2018 | Lin | H01L 28/20 361/56 |
| 2019/0237967 A1* | 8/2019 | Knoedgen | H02H 9/046 |

OTHER PUBLICATIONS

Office Action and Search Report dated Nov. 28, 2019 issued by Korean Intellectual Patent Office for counterpart application No. 10-2018-0118940.
English Abstract Translation of Foreign Reference of CN 102739164.
Office Action and Search Report dated Mar. 3, 2020 issued by Taiwan Intellectual Property Office for counterpart application No. 107136060.
Notice of Allowance and its translation dated Sep. 25, 2020 issued by Korean Intellectual Property Office for counterpart application No. 10-2018-0118940.

* cited by examiner

CIRCUIT, SYSTEM AND METHOD FOR ELECTROSTATIC DISCHARGE (ESD) PROTECTION

CROSS-REFERENCE TO RELATED APPLICATION

This application claims the benefit of U.S. Provisional Application No. 62/572,085, filed Oct. 13, 2017.

BACKGROUND

Electrostatic discharge (ESD) events can happen anywhere such as fabrication and assembly process areas, production testing environments, transportation, and field applications. ESD may be caused by the user's application due to a transient, excessive supply current, poor grounding, low resistance path between supply voltage and ground, shorted pins, and internal damage of the circuit. An ESD event may carry amperes of current in a short period of time, typically from hundreds of pico-seconds to hundreds of nano-seconds. Such events are very harmful for sensitive electronic components and integrated circuits (ICs). The IC may eventually fail if it is exposed to conditions beyond the datasheet specifications. An ESD protection device in an IC protects a circuit from an ESD zapping in order to prevent malfunction or breakdown of the IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
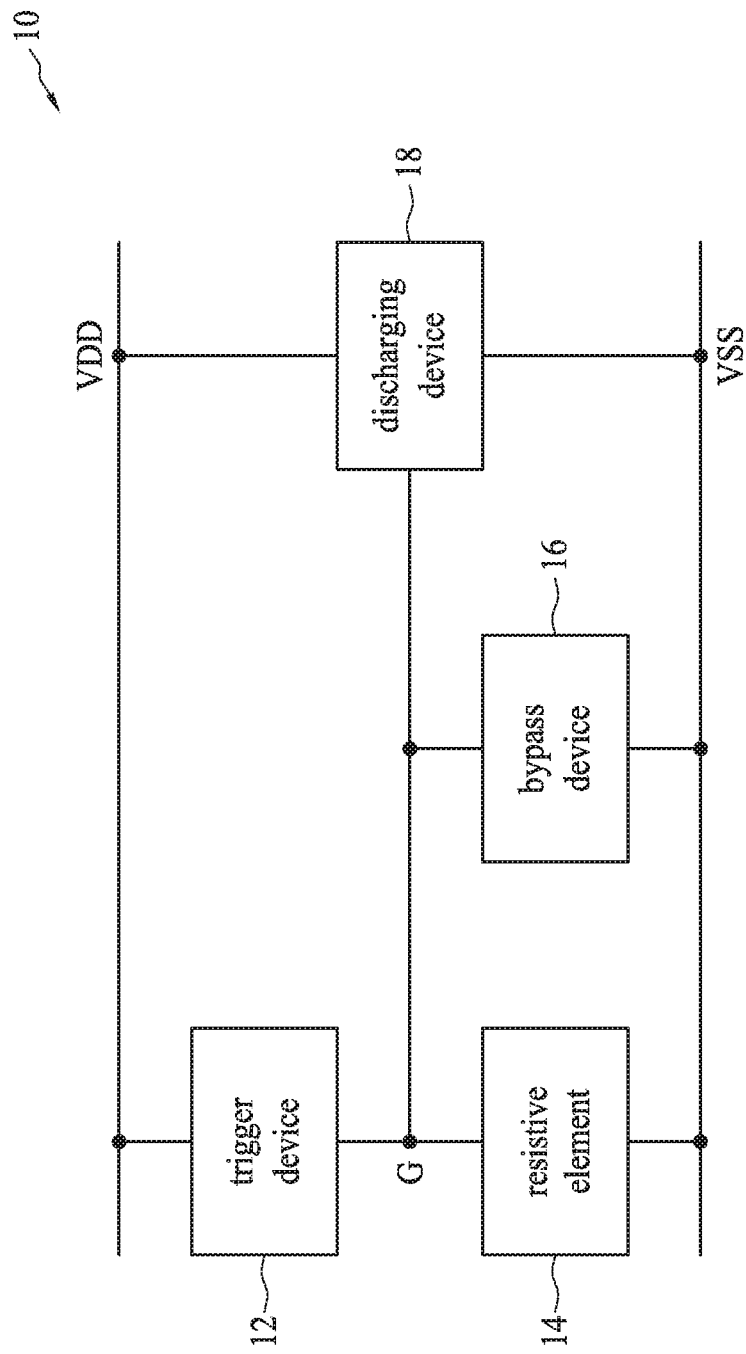
FIG. 1 is a block diagram of an electrostatic discharge (ESD) device for ESD protection, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides an electrostatic discharge (ESD) device for ESD protection. The ESD device includes a trigger device, a resistive element and a bypass device. The trigger device is configured to detect an ESD event and issue a trigger signal when an ESD event is detected. The resistive element builds a voltage drop in response to the trigger signal due to a high-to-low ESD zap in order to activate a discharging device for discharging an ESD current. The high-to-low ESD zap corresponds to a PS mode or an ND mode of ESD stress. The bypass device is configured to bypass the resistive element and activate the discharging device in response to the trigger signal due to a low-to-high ESD zap. The low-to-high ESD zap corresponds to a PD mode or an NS mode of ESD stress, FIG. 1 is a block diagram of an electrostatic discharge (ESD) device 10 for ESD protection, in accordance with some embodiments.

Referring to FIG. 1, the ESD device 10 includes a trigger device 12, a resistive element 14, a bypass device 16 and a discharging device 18. The discharging device 18 is coupled between a first voltage bus VDD and a second voltage bus VSS. In an embodiment, VDD ranges from approximately 6 volts (V) to approximately 20 V, and VSS is a reference voltage such as a ground voltage. The discharging device 18 is normally kept at an off state until an ESD event occurs. The trigger device 12 detects if an ESD event occurs and, if affirmative, sends a trigger signal to a node G in response to the ESD event in order to activate the discharging device 18.

ESD events, depending on the polarity of electrostatic charge and the discharge path, may be classified into four zapping modes: PS mode, NS mode, PD mode and ND mode.

(1) The PS mode refers to the case when a positive ESD voltage is applied to a pin in a chip with the VSS pin being grounded while the VDD pin and the other pins floating.

(2) The NS mode refers to the case when a negative ESD voltage is applied to a pin in a chip with the VSS pin being grounded while the VDD pin and the other pins floating.

(3) The PD mode refers to the case when a positive ESD voltage is applied to a pin in a chip with the VDD pin being grounded while the VSS pin and the other pins floating.

(4) The ND mode refers to the case when a negative ESD voltage is applied to a pin in a chip with the VDD pin being grounded while the VSS pin and the other pins floating.

In the present disclosure, a high-to-low (hereinafter "HL") zap occurs when a relatively high ESD stress appears on the first voltage bus VDD and the second voltage bus VSS is relatively low, which corresponds to the above-mentioned PS mode and ND mode. In addition, a low-to-high (hereinafter "LH") zap occurs when a relatively low ESD stress appears on the first voltage bus VDD and the second voltage bus VSS is relatively high, which corresponds to the above-mentioned PD mode and NS mode.

The resistive element 14, in response to a trigger signal at the node G due to an HL ESD event, builds a voltage drop to activate the discharging device 18. The resistive element 14 is efficient in responding to an HL ESD, but may not be as efficient in responding to an LH ESD. In response to an LH ESD event, the resistive element 14 is bypassed by the bypass device 16. In operation, the bypass device 16, in response to a trigger signal at the node G due to an LH ESD event, activates the discharging device 18. As a result, the discharging device 18 discharges an ESD current between the first voltage bus VDD and the second voltage bus VSS.

Figure 2:
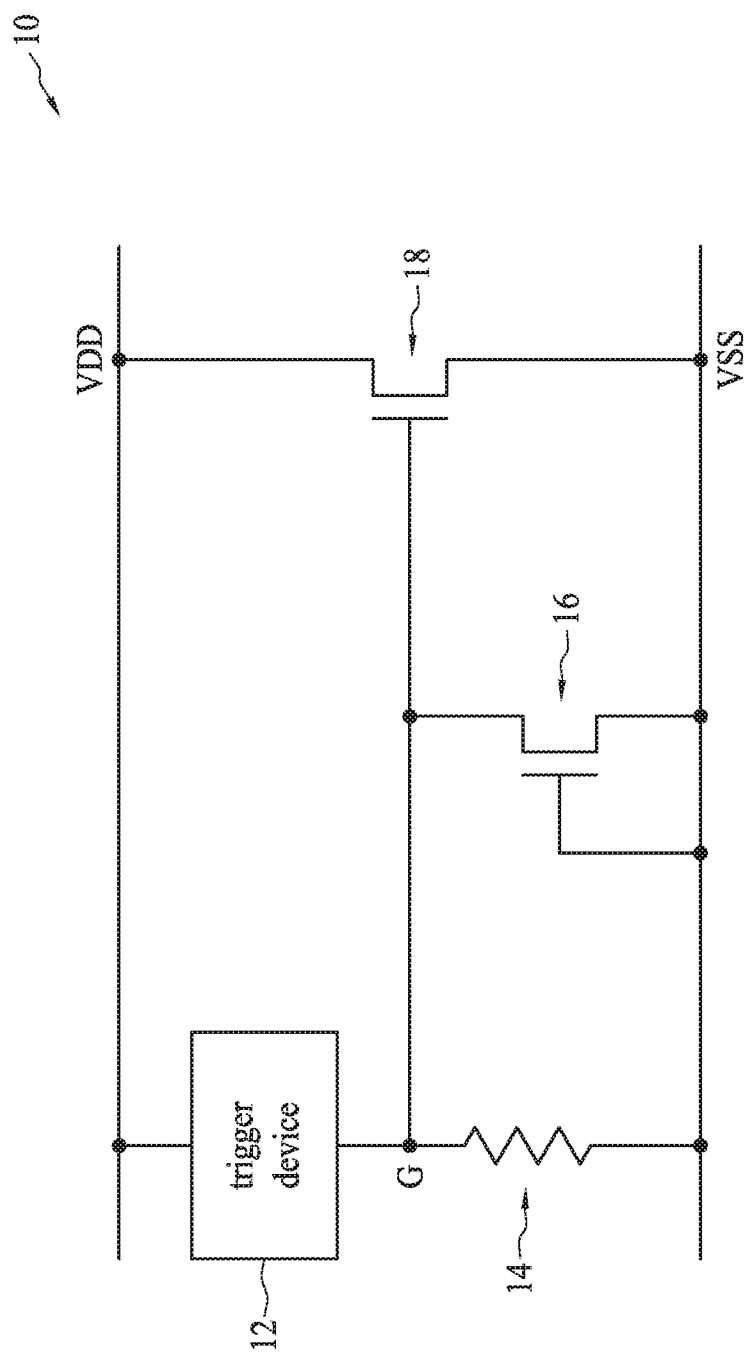
FIG. 2 is a circuit diagram of the ESD device illustrated in FIG. 1, in accordance with some embodiments.

FIG. 2 is a circuit diagram of the ESD device 10 illustrated in FIG. 1, accordance with some embodiments.

Referring to FIG. 2, the resistive element 14 of the ESD device 10 includes a resistor. In an embodiment, the resistance of the resistor is approximately 300 kilo ohms (Km. The discharging device 18 of the ESD device 10 includes a transistor such as an n-type transistor. In an embodiment, the discharging device 18 includes a high-electron-mobility transistor (HEMT), for example, a gallium nitride (GaN) HEMT. HEMTs are often used as digital on-off switches in integrated circuits. A HEMT, also called modulation-doped field effect transistor (MODFET) or hetero-structure FET (HFET), is an FET that incorporates a hetero-junction between two materials with different band gaps. The hetero-junction serves as a channel region instead of a doped region as is generally the case for a metal-oxide-semiconductor FET (MOSFET). Due to the channel structure is different from silicon CMOS, a HEMT has no source/bulk to drain body diode structure, and thus may not effectively discharge an LH ESD. Moreover, due to the duration of an ESD event ranges from approximately 300 nanoseconds to approximately 1 microsecond (µs), a trigger device with a sufficiently large voltage maintenance resistor may be required. However, as previously discussed, the resistor may reduce the performance of an ESD protection circuit in the case of an LH ESD zapping.

With the help of the bypass device 16, the resistor 14 is bypassed and the HEMT 18 is activated to discharge an LH ESD. In the present embodiment, the bypass device 16 includes a transistor such as an n-type transistor, which is normally kept at an off state until an ESD event occurs. In an embodiment, the bypass device 16 includes a HEMT. In the case that both the discharging transistor 18 and the bypass transistor 16 are HEMTs, the discharging transistor 18 has a gate width ranging from approximately 300 micrometers (µm) to 100,000 µm, for example, 5,600 µm, while the bypass transistor 16 has a gate width ranging from approximately 5 µm to 400 µm, for example, 400 µm.

A first terminal of the trigger device 12 is coupled to the first voltage bus VDD. A second terminal of the trigger device 12 is coupled to the node G. In addition, one end of the resistor 14 is coupled to the node G and hence to the second terminal of the trigger device 12, while the other end of the resistor 14 is coupled to the second voltage bus VSS. Moreover, a gate of the HEMT 18 is coupled to the node G and hence to the second terminal of the trigger device 12 and the one end of the resistor 14. A drain of the HEMT is coupled to the first voltage bus VDD. A source of the HEMT is coupled to the second voltage bus VSS. Persons having ordinary skill in the art will understand that drain and source terminals of a transistor may be interchanged, depending on the voltage levels applied thereto. Further, a gate of the HEMT 16 is coupled to the second voltage bus VSS. A drain of the HEMT 16 is coupled to the node G and hence to the second terminal of the trigger device 12, the one end of the resistor 14 and the gate of the HEMT 18. A source of the HEMT 16 is also coupled to the second voltage bus VSS.

In operation, in response to a PS-mode ESD event during which the first voltage bus VDD is relatively high while the second voltage bus VSS is relatively low, the bypass transistor 16 is kept off. Meanwhile, the trigger device 12 detects the ESD event and issues a trigger signal at the node G. A voltage drop across the resistor 14 is built in response to the trigger signal, which turns on the discharging transistor 18. The discharging transistor 18 then discharges an ESD current from the first voltage bus VDD towards the second voltage bus VSS.

In response to an ND-mode ESD event during which the second voltage bus VSS is relatively low while the first voltage bus VDD is relatively high, the bypass transistor 16 is kept off. Meanwhile, the trigger device 12 detects the ESD event and issues a trigger signal at the node G. Likewise, a voltage drop across the resistor 14 is built in response to the trigger signal, which turns on the discharging transistor 18. The discharging transistor 18 then discharges an ESD current from the first voltage bus VDD towards the second voltage bus VSS.

As a result, in response to an HL ESD event that corresponds to the PS-mode ESD or the ND-mode ESD, the bypass transistor 16 is kept off and the resistor 14 functions to activate the discharging transistor 18.

In response to a PD-mode ESD event during which the second voltage bus VSS is relatively high while the first voltage bus VDD is relatively low, the bypass transistor 16 is turned on due to the relatively high VSS. As the bypass transistor 16 is turned on, the resistor 14 is bypassed. Meanwhile, the gate of the discharging transistor 18 is biased at the relatively high VSS, which turns on the discharging transistor 18. The discharging transistor 18 then discharges an ESD current from the second voltage bus VSS towards the first voltage bus VDD.

In response to an NS-mode ESD event during which the first voltage bus VDD is relatively low while the second voltage bus VSS is relatively high, the bypass transistor 16 is turned on due to the relatively high VSS. Likewise, as the bypass transistor 16 is turned on, the resistor 14 is bypassed. Meanwhile, the gate of the discharging transistor 18 is biased at the relatively high VSS, which turns on the discharging transistor 18. The discharging transistor 18 then discharges an ESD current from the second voltage bus VSS towards the first voltage bus VDD.

As a result, in response to an LH ESD event that corresponds to the PD-mode ESD or the NS-mode ESD, the bypass transistor 16 is turned on and activates the discharging transistor 18. The resistor 14 is bypassed by the bypass transistor 16.

Semiconductor devices are often provided with ESD protection circuitry. To ensure that their effectiveness and reliability meet the requirements of JEDEC standards, ESD tests are required. The ESD tests may include the human body model (HBM), the charge device model (CDM), and the machine model (MM). The HBM represents an ESD event caused by a charged human discharging the current into a grounded IC. The MM represents a discharge coming from a charged machine, tool or equipment into a grounded IC. This ESD model is typically used in auto-motive assembly lines. The CDM covers the ESD discharge when a device or an IC is self-charged during the manufacturing process and comes into contact with grounded equipment. These ESD qualification tests (HBM, MM and CDM) are often destructive in nature. Users only get the feedback whether or not a device under test (DUT) meets the standards. Therefore, these tests are supplemented with a non-destructive test to collet additional information for analysis and design optimization. Obviously, detailed information on the ESD behavior of protection elements and circuits are required for their optimization. For such analysis and design optimization, transmission line pulsing (TLP) technique is employed as an alternative and supplement to the model-based ESD qualifications. The TLP technique has gained popularity in the semiconductor industry in recent years due to its flexibility and ease of generating pulses with different pulse widths and magnitudes. In addition, the TLP testing is not destructive in nature. The TLP technique is based on charging a long, floating cable to a pre-determined voltage, and discharging it into a DUT. The cable discharge emulates an electro-static discharge event, but employing time-domain reflectometry (TDR), the change in DUT impedance can be monitored as a function of time.

Figure 3A:
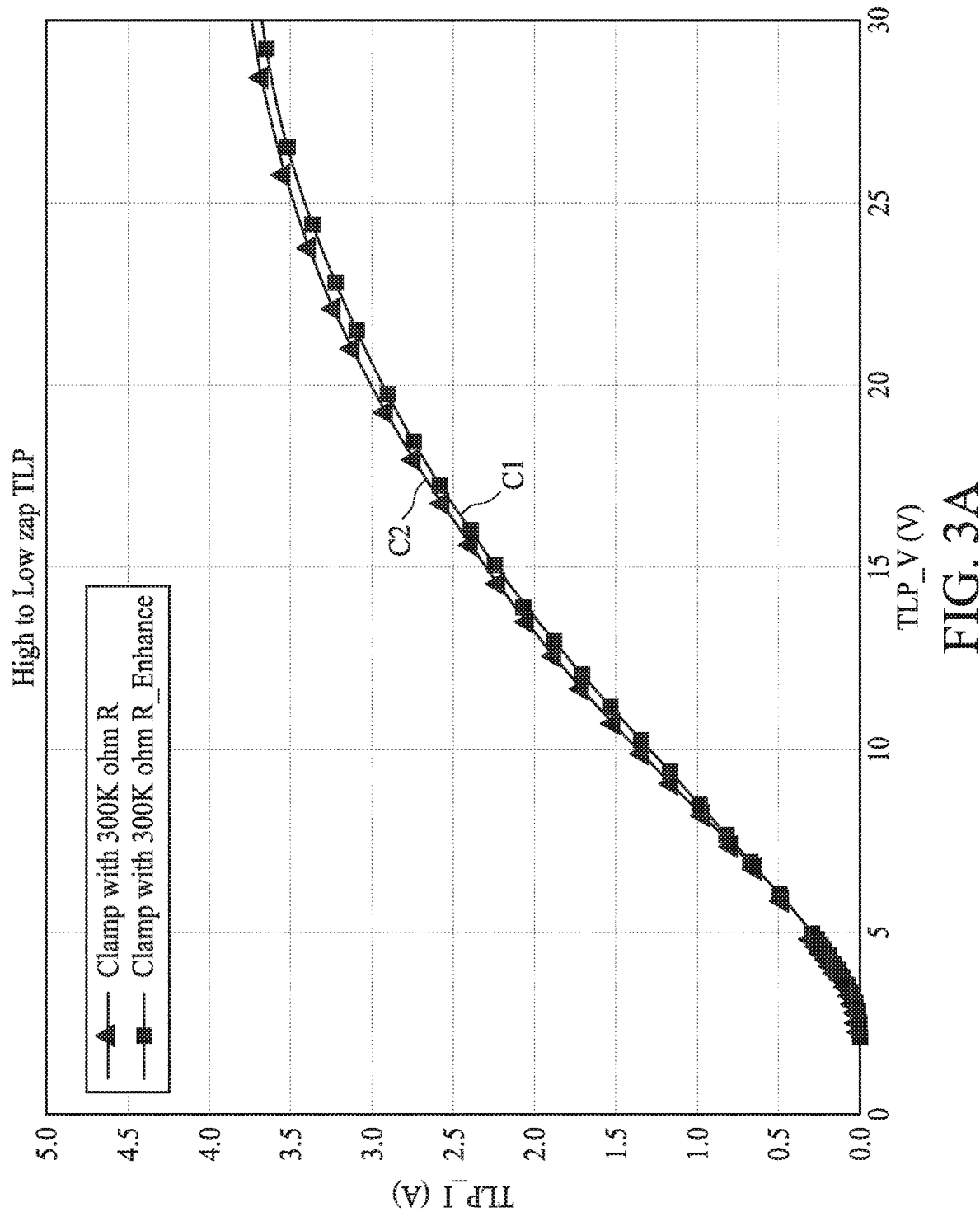
FIG. 3A is a diagram showing a simulation result of a high-to-low zapping on the ESD device illustrated in FIG. 2.

FIG. 3A is a diagram showing a simulation result of a high-to-low zapping on the ESD device 10 illustrated in FIG. 2. For investigation of ESD effects, a TLP generator is employed to study circuit behavior in the current and time domain of ESD events. TLP I-V characteristics show how much current flow can be allowed against constant short-period pulse waves resembling ESD surge on protection elements and protected elements.

Referring to FIG. 3A, curve C1 represents a result of simulation on the ESD device 10 in an embodiment of the present disclosure, while curve C2 represents a result of simulation on an existing ESD device without a bypass device. As shown in FIG. 3A, the curve C1 substantially overlaps with the curve C2. As a result, the ESD device 10 can be considered as equally efficient as the existing approach. The bypass device 16 does not impact the performance of the ESD device 10 in responding to an HL ESD event.

Figure 3B:
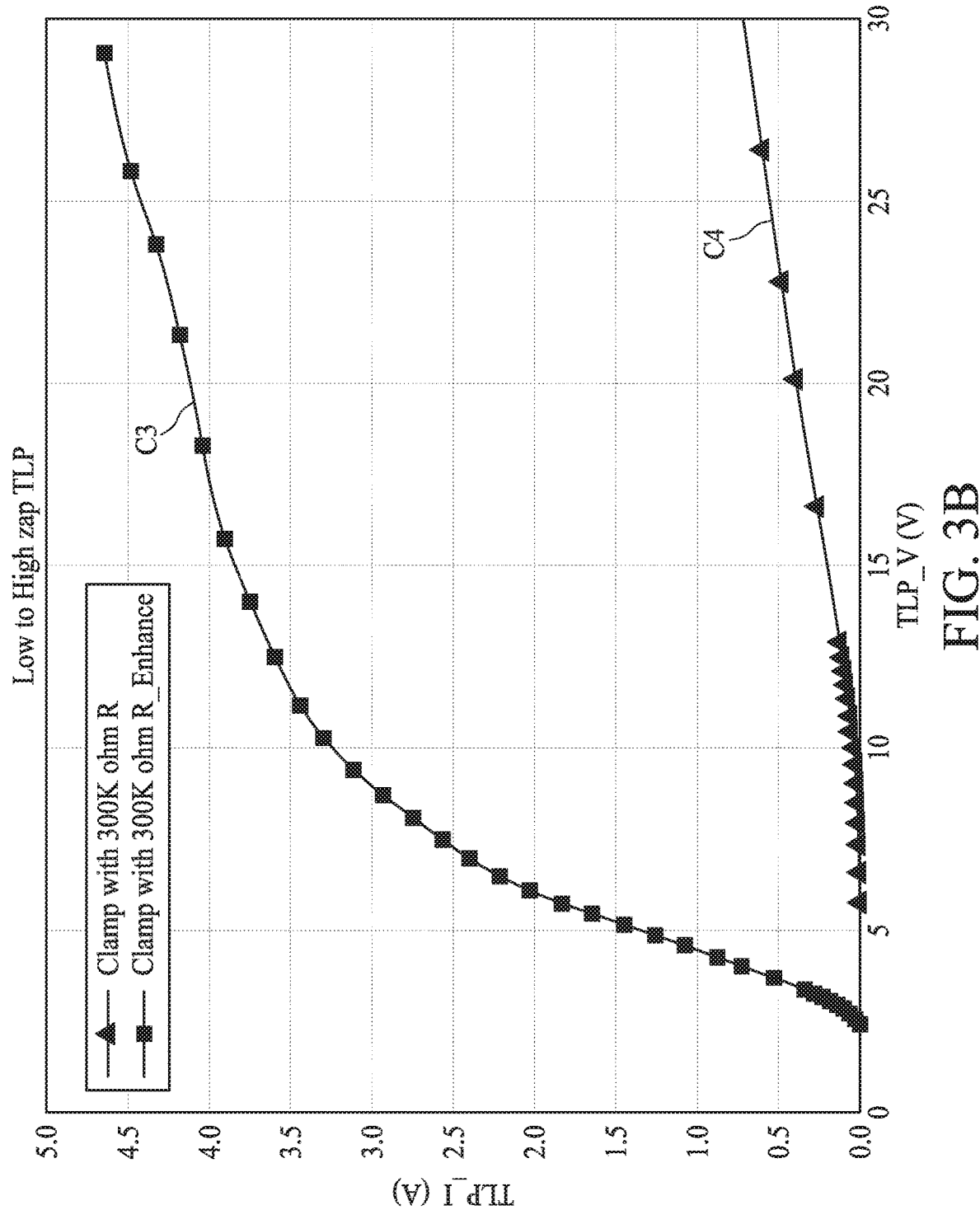
FIG. 3B is a diagram showing a simulation result of a low-to-high zapping on the ESD device illustrated in FIG. 2.

FIG. 3B is a diagram showing a simulation result of a low-to-high zapping on the ESD device 10 illustrated in FIG. 2.

Referring to FIG. 3B, curve C3 represents a result of simulation on the ESD device 10 in an embodiment of the present disclosure, while curve C4 represents a result of simulation on an existing ESD device without a bypass device. As shown in FIG. 3B, for any given pulse waves, the allowed current flow in the ESD device 10 (represented by the curve C3) is significantly larger than that in the existing ESD device (represented by the curve C4). Accordingly, the ESD device 10 apparently outperforms the existing ESD device. As a result, with the bypass device 16, the performance of the ESD device 10 in responding to an LH ESD event is significantly enhanced.

Figure 4:
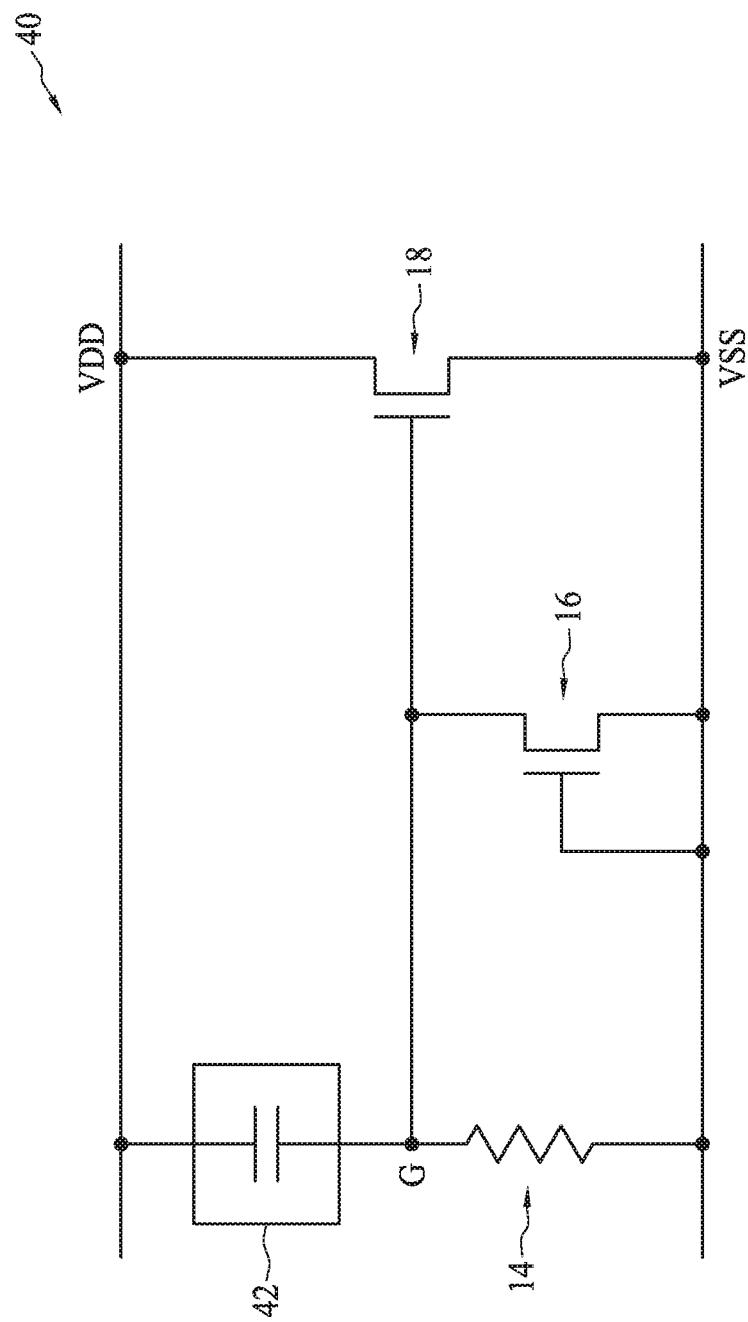
FIG. 4 is a circuit diagram of an ESD device, in accordance some embodiments.

FIG. 4 is a circuit diagram of an ESD device 40, in accordance with some embodiments.

Referring to FIG. 4, the ESD device 40 is similar to the ESD device 10 described and illustrated with reference to FIG. 2 except that, for example, a capacitor 42 serves as a trigger device. The capacitor 42 is coupled between the first voltage bus VDD and the node G. Specifically, one end of the capacitor 42 receives VDD, and the other end is coupled to the node G. By function of coupling effect, the capacitor 42 facilitates a voltage drop across the resistor 14 to be built in response to an HL ESD event, and thus activates the discharging transistor 18.

Figure 5:
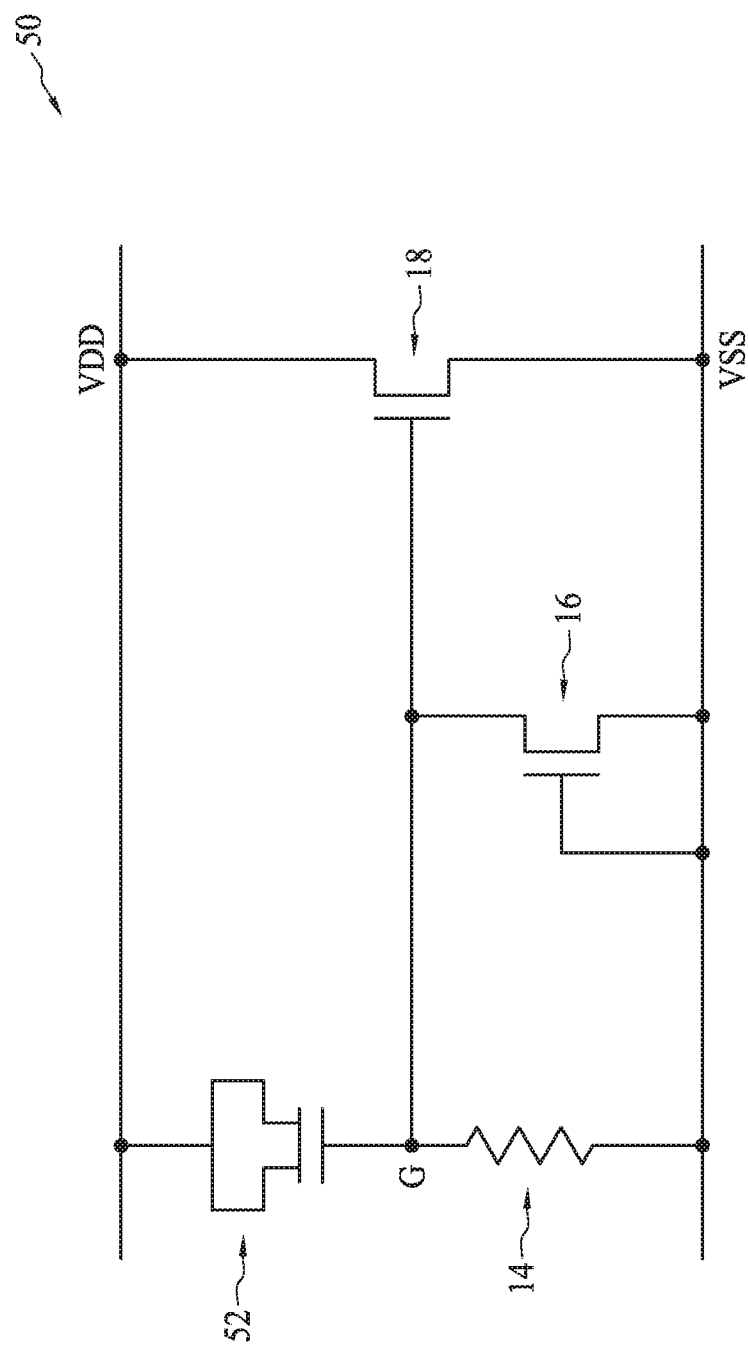
FIG. 5 is a circuit diagram of an ESD device, in accordance with some embodiments.

FIG. 5 is a circuit diagram of an ESD device 50, in accordance with some embodiments.

Referring to FIG. 5, the ESD device 50 is similar to the ESD device 10 described and illustrated with reference to FIG. 2 except that, for example, a transistor 52 serves as a trigger device. The transistor 52 is coupled between the first voltage bus VDD and the node G. Specifically, a source and a drain of the transistor 52 receive VDD, and a gate of the transistor 52 is coupled to the node G. The transistor 52 functions like a capacitor, and facilitates a voltage drop across the resistor 14 to be built in response to an HL ESD event, which activates the discharging transistor 18. In an embodiment, the transistor 52 includes an n-type transistor. In another embodiment, the transistor 52 includes a HEMT.

Figure 6:
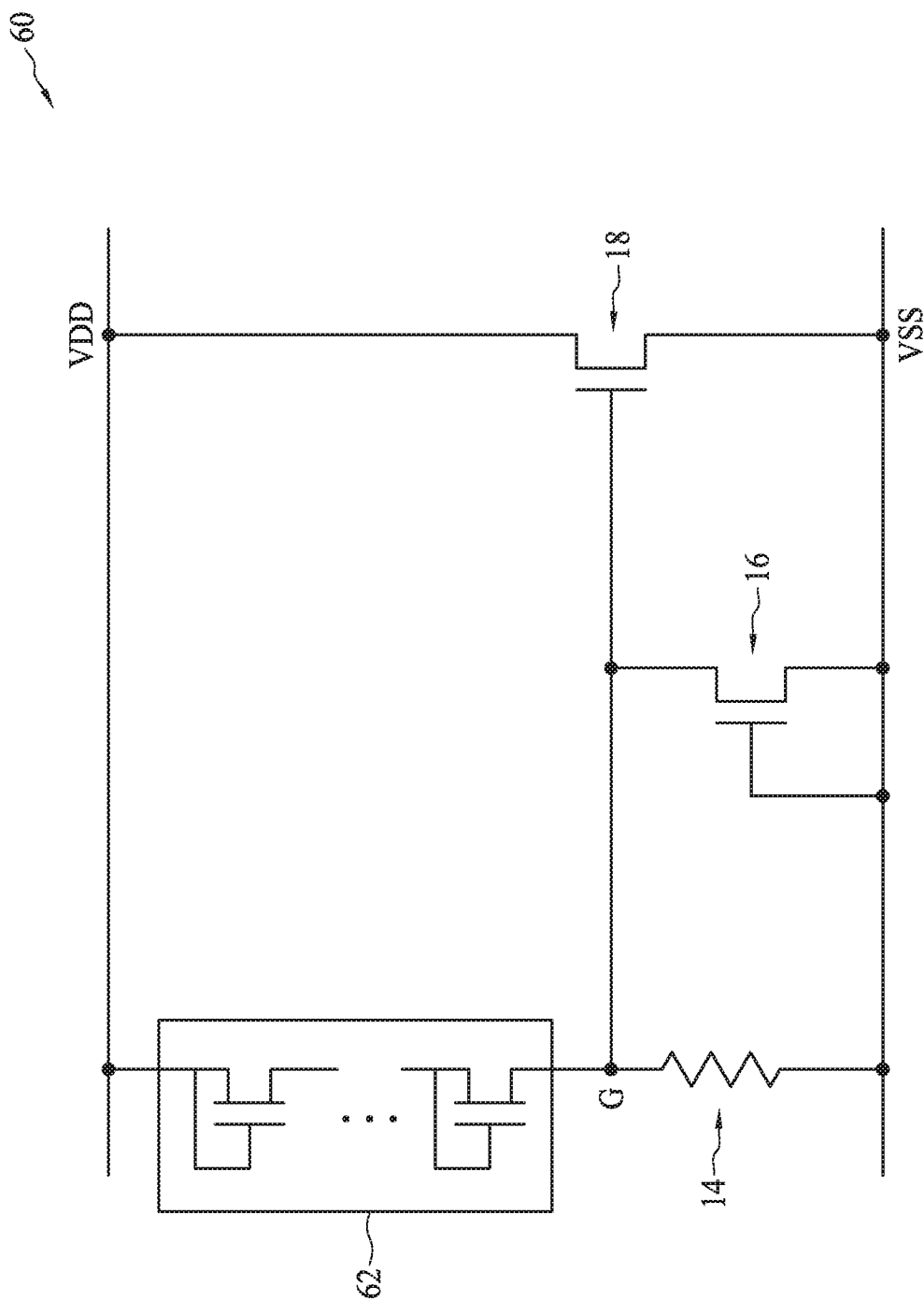
FIG. 6 is a circuit diagram of an ESD device, in accordance some embodiments.

FIG. 6 is a circuit diagram of an ESD device 60, in accordance with some embodiments.

Referring to FIG. 6, the ESD device 60 is similar to the ESD device 10 described and illustrated with reference to FIG. 2 except that, for example, transistors 62 serve as a trigger device. The transistors 62 are cascode connected between the first voltage bus VDD and the node G. In the cascode-connected transistors 62, a gate and a drain of the uppermost transistor in the cascode string receive VDD, and a gate and a drain of each of the remaining transistors 62 are coupled to a source of an immediately upper transistor in the cascode string. Moreover, a source of the lowest transistor in the cascode string is coupled to the node G. The transistors 62 function like a diode string, and facilitate a voltage drop across the resistor 14 to be built in response to an HL ESD event, which activates the discharging transistor 18. In an embodiment, the transistors 62 include n-type transistors. In another embodiment, the transistors 62 include HEMTs.

Figure 7:
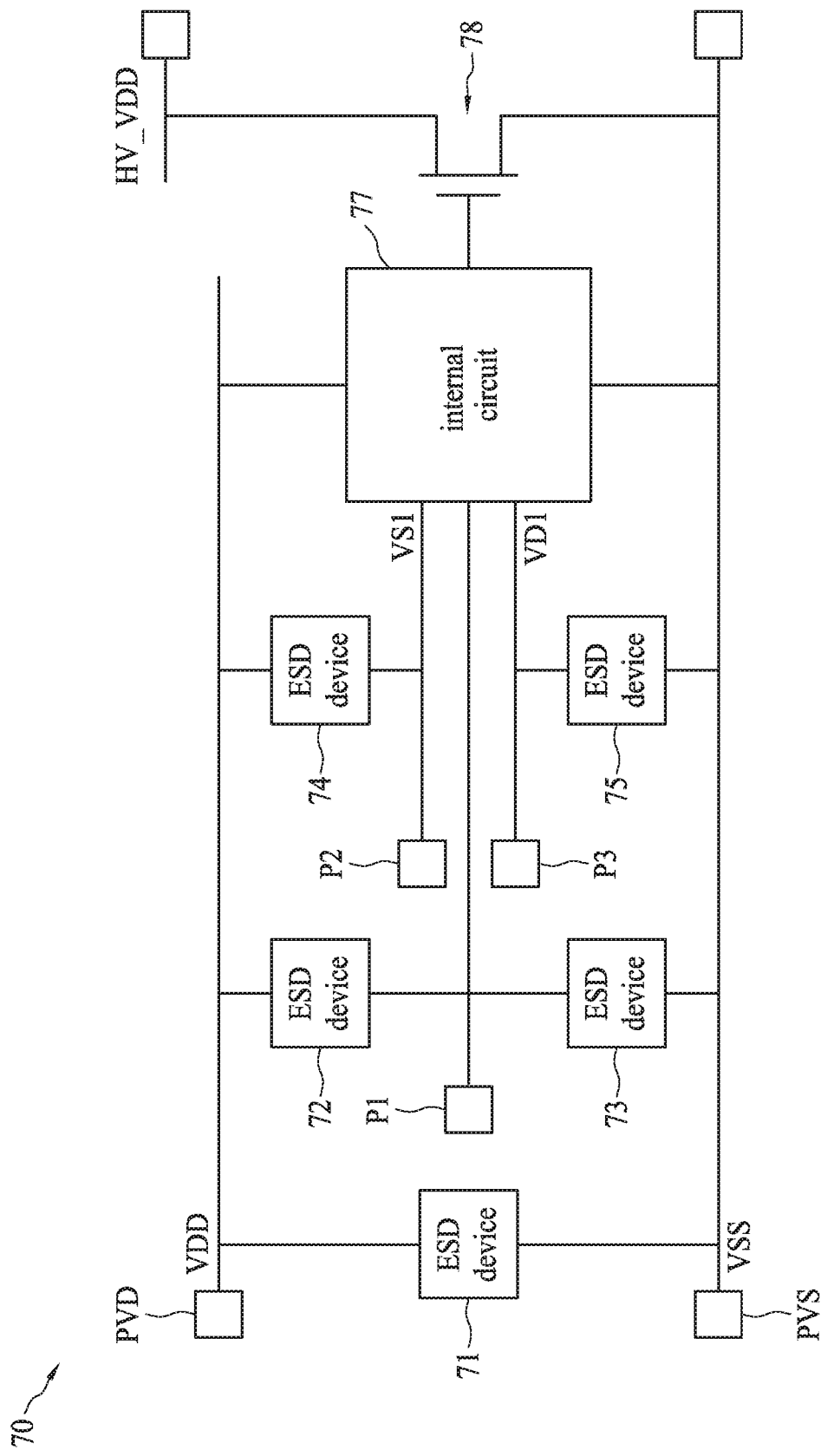
FIG. 7 is a schematic diagram of a system ESD protection, in accordance with some embodiments.

FIG. 7 is a schematic diagram of a system 70 for ESD protection, in accordance with some embodiments.

Referring to FIG. 7, the system 70, for example, a semiconductor chip, includes ESD devices 71 to 75 configured to protect an internal circuit 77 from an ESD events. Each of the ESD devices 71 to 75 may include one of the ESD devices 10, 40, 50 and 60 as described and illustrated with reference to FIGS. 2, 4, 5 and 6, respectively. The system 70 also includes a transistor 78 such as a HEMT for ESD protection. The transistor 78, disposed between a voltage bus HV_VDD and the second voltage bus VSS, is kept at an off state during normal operation and is activated in response to an ESD event. In an embodiment, the HV_VDD ranges from approximately 100 V to 600 V. The internal circuit 77, disposed between the first voltage bus VDD and the second voltage bus VSS, communicates with other components in the chip or an external device through input/output (I/O) pins or pads P1, P2 and P3.

The first ESD device 71 is disposed between the first voltage bus VDD and the second voltage bus VSS. In an embodiment, the first ESD device 71 is configured to discharge an ESD current towards the second voltage bus VSS in response to a PS-mode zapping on a pin PVD connected to VDD (the "VDD pin") or in response to an ND-mode zapping on a pin PVS connected to VSS (the "VSS pin"). Also, the first ESD device 71 is configured to discharge an ESD current towards the first voltage bus VDD in response to an NS-mode zapping on the pin PVD or in response to a PD-mode zapping on the pin PVS.

The second ESD device 72 is disposed between the first voltage bus VDD and the first pin P1. In an embodiment, the second ESD device 72 is configured to discharge an ESD current towards the first voltage bus VDD in response to an NS-mode zapping on the pin PVD or in response to a PD-mode zapping on the first I/O pin P1.

The third ESD device 73 is disposed between the first I/O pin P1 and the second voltage bus VSS. In an embodiment, the third ESD device 73 is configured to discharge an ESD current towards the second voltage bus VSS in response to a PS-mode zapping on the first I/O pin P1 or in response to an ND-mode zapping on the pin PVS.

The fourth ESD device 74 is disposed between the first voltage bus VDD and the second I/O pin P2. The second I/O pin P2 is coupled to the internal circuit 77 via a first internal bus VS1, which has a voltage level lower than VDD and higher than VSS. In an embodiment, the fourth ESD device 74 is configured to discharge an ESD current towards the first internal bus VS1 in response to a PS-mode zapping on the pin PVD or in response to an ND-mode zapping on the second I/O pin P2. Also, the fourth ESD device 74 is configured to discharge an ESD current towards the first voltage bus VDD in response to an NS-mode zapping on the pin PVD or in response to a PD-mode zapping on the second pin P2.

The fifth ESD device 75 is disposed between the third I/O pin P3 and the second voltage bus VSS. The third I/O pin P3 is coupled to the internal circuit 77 via a second internal bus VD1, which has a voltage level lower than VDD and higher than VSS. In an embodiment, the fifth ESD device 75 is configured to discharge an ESD current towards the second voltage bus VSS in response to a PS-mode zapping on the third I/O pin P3 or in response to an ND-mode zapping on the pin PVS. Also, the fifth ESD device 75 is configured to discharge an ESD current towards the second internal bus VD1 in response to an NS-mode zapping on the third I/O pin P3 or in response to a PD-mode zapping on the pin PVS.

Figure 8:
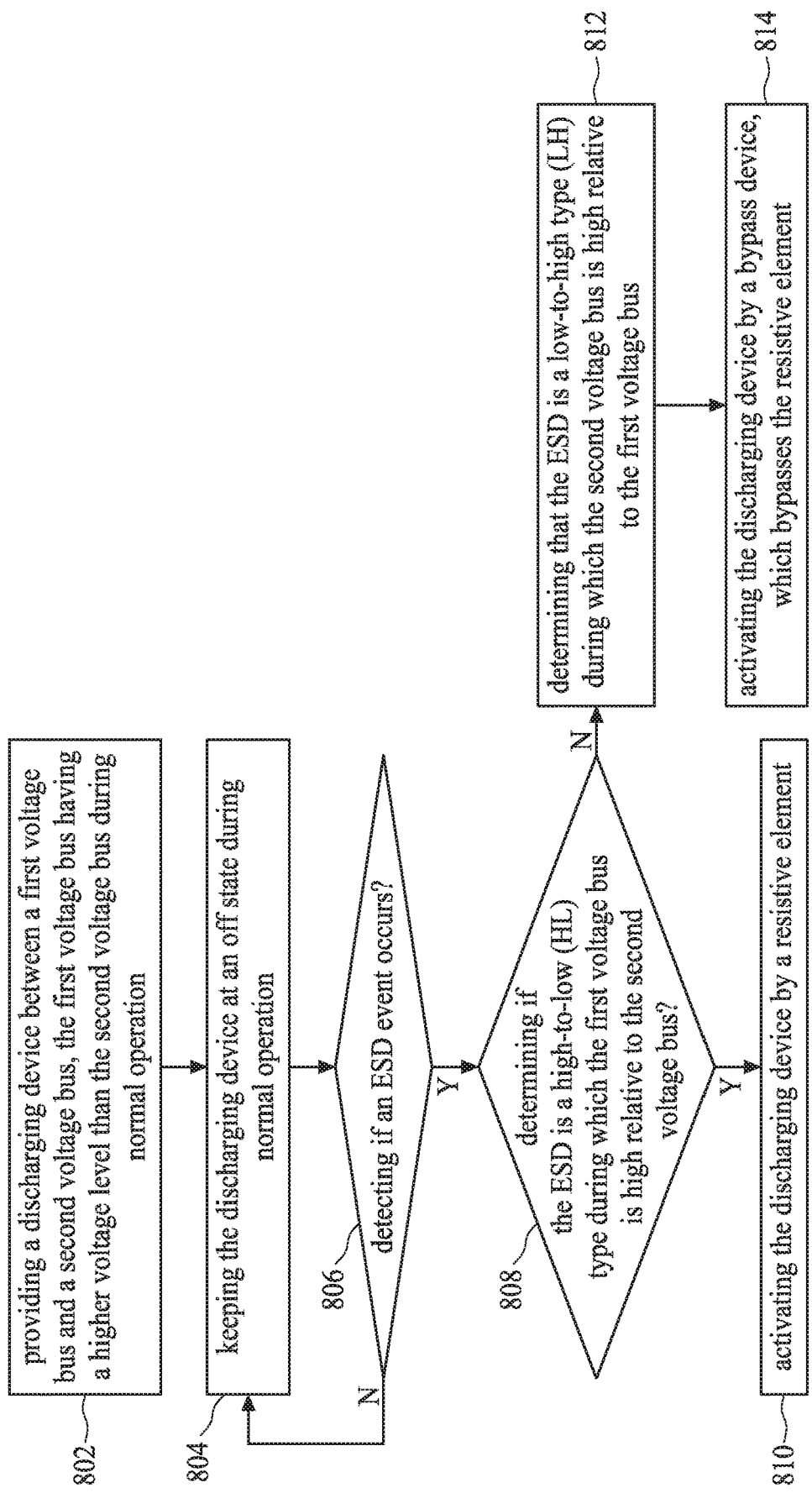
FIG. 8 is a flow diagram showing a method of ESD protection, in accordance with some embodiments.

FIG. 8 is a flow diagram showing a method of ESD protection, in accordance with some embodiments.

Referring to FIG. 8, in operation 802 a discharging device is provided between a first voltage bus and a second voltage bus. The first voltage bus has a higher voltage level than the second voltage bus during normal operation.

In operation 804, the discharging device is kept at an off state during normal operation. As a result, the discharging device does not interfere with other circuit components and consumes a relatively low power during normal operation.

In operation 806, whether an ESD event occurs is detected. If no ESD event occurs, the discharging device is kept at the off state. If an ESD event is detected, then in operation 808 it is determined whether the ESD event is a high-to-low (HL) type, during which the first voltage bus is high in potential relative to the second voltage bus. If affirmative, the discharging device is activated by a resistive element in operation 810. If not, in operation 812 it is determined that the ESD event is a low-to-high (LH) type, during which the second voltage bus is high in potential relative to the first voltage bus. Subsequently in operation 814 the discharging device is activated by a bypass device, which bypasses the resistive element.

In some embodiments, the present disclosure provides a circuit that includes a discharging device, a resistive element and a bypass device. The discharging device is disposed between a first voltage bus and a second voltage bus. The resistive element is configured to activate the discharging device in response to a high-to-low electrostatic discharge (ESD) event during which the first voltage bus is high in potential relative to the second voltage bus. The bypass device is configured to bypass the resistive element and activate the discharging device in response to a low-to-high ESD event during which the second voltage bus is high in potential relative to the first voltage bus.

In some embodiments, the present disclosure also provides a system that includes an internal circuit and a number of devices configured to protect the internal circuit from an ESD event. Each of the devices includes a discharging device, a resistive element and a bypass device. The discharging device is disposed between a first voltage bus and a second voltage bus. The resistive element is configured to activate the discharging device in response to a high-to-low electrostatic discharge (ESD) event during which the first voltage bus is high in potential relative to the second voltage bus. The bypass device is configured to bypass the resistive element and activate the discharging device in response to a low-to-high ESD event during which the second voltage bus is high in potential relative to the first voltage bus.

In some embodiments, the present disclosure provides a method. The method includes providing a discharging device between a first voltage bus and a second voltage bus, the first voltage bus having a higher voltage level than the second voltage bus during normal operation, activating the discharging device by a resistive element in response to an ESD event of a high-to-low (HL) type during which the first voltage bus is high in potential relative to the second voltage bus, and activating the discharging device by a bypass device in response to an ESD event of a low-to-high (HL) type during which the second voltage bus is high in potential relative to the first voltage bus, the bypass device bypassing the resistive element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
   a discharging device between a first voltage bus and a second voltage bus;
   a resistive element configured to activate the discharging device in response to a high-to-low electrostatic discharge (ESD) event during which the first voltage bus is high in potential relative to the second voltage bus; and
   a bypass device connected parallel to the resistive element and configured to bypass the resistive element and activate the discharging device in response to a low-to-high ESD event during which the second voltage bus is high in potential relative to the first voltage bus, wherein the bypass device is kept off in response to the high-to-low ESD event.

2. The circuit according to claim 1 further comprising a trigger device configured to detect an ESD event, wherein the trigger device is disposed between the first voltage bus and one end of the resistive element.

3. The circuit according to claim 2, wherein the trigger device includes a capacitor.

4. The circuit according to claim 2, wherein the trigger device includes a transistor including a source and a drain together coupled to the first voltage bus, and including a gate coupled to the one end of the resistive element.

5. The circuit according to claim 4, wherein the transistor includes a high-electron-mobility transistor (HEMT).

6. The circuit according to claim 2, wherein the trigger device includes a number of transistors cascode connected.

7. The circuit according to claim 6, wherein each of the transistors includes a HEMT.

8. The circuit according to claim 2, wherein the discharging device includes a HEMT, the HEMT including a drain coupled to the first voltage bus, a source coupled to the second voltage bus, and a gate coupled to the one end of the resistive element.

9. The circuit according to claim 2, wherein the bypass device includes a HEMT, the HEMT including a source coupled to the second voltage bus, a gate coupled to the second voltage bus, and a drain coupled to the one end of the resistive element.

10. A system, comprising:
an internal circuit; and
a number of devices configured to protect the internal circuit from an ESD event, each of the devices including:
  a discharging device between a first voltage bus and a second voltage bus;
  a resistive element configured to activate the discharging device in response to a high-to-low electrostatic discharge (ESD) event during which the first voltage bus is high in potential relative to the second voltage bus; and
  a bypass device connected parallel to the resistive element and configured to bypass the resistive element and activate the discharging device in response to a low-to-high ESD event during which the second voltage bus is high in potential relative to the first voltage bus, wherein the bypass device is kept off in response to the high-to-low ESD event.

11. The system according to claim 10, wherein a first one of the devices is disposed between the first voltage bus and the second voltage bus, the first device configured to discharge an ESD current towards one of the first voltage bus and the second voltage bus in response to an ESD event.

12. The system according to claim 10, wherein a second one of the devices is disposed between the first voltage bus and a first conductive pin, the second device configured to discharge an ESD current towards the first voltage bus in response to an ESD event.

13. The system according to claim 12, wherein a third one of the devices is disposed between the first conductive pin and the second voltage bus, the third device configured to discharge an ESD current towards the second voltage bus in response to an ESD event.

14. The system according to claim 10, wherein a fourth one of the devices is disposed between the first voltage bus and a second conductive pin coupled to the internal circuit via a first internal bus, the fourth device configured to discharge an ESD current towards one of the first voltage bus and the first internal bus in response to an ESD event.

15. The system according to claim 14, wherein a fifth one of the devices is disposed between the second voltage bus and a third conductive pin coupled to the internal circuit via a second internal bus, the fifth device configured to discharge an ESD current towards one of the second voltage bus and the second internal bus in response to an ESD event.

16. The system according to claim 10, wherein each of devices further includes a trigger device configured to detect an ESD event, wherein the trigger device is disposed between the first voltage bus and one end of the resistive element.

17. The system according to claim 16, wherein the discharging device includes a HEMT, the HEMT including a drain coupled to the first voltage bus, a source coupled to the second voltage bus, and a gate coupled to the one end of the resistive element.

18. The system according to claim 16, wherein the bypass device includes a HEMT, the HEMT including a source coupled to the second voltage bus, a gate coupled to the second voltage bus, and a drain coupled to the one end of the resistive element.

19. A method, comprising:
providing a discharging device between a first voltage bus and a second voltage bus, the first voltage bus having a higher voltage level than the second voltage bus during normal operation;
activating the discharging device by a resistive element in response to an ESD event of a high-to-low (HL) type during which the first voltage bus is high in potential relative to the second voltage bus;
activating the discharging device by a bypass device in response to an ESD event of a low-to-high (LH) type during which the second voltage bus is high in potential relative to the first voltage bus, the bypass device connected parallel to the resistive element and bypassing the resistive element; and
keeping the bypass device off in response to an ESD event of the HL type.

20. The method according to claim 19, wherein the discharging device is kept at an off state during normal operation.

* * * * *